United States Patent [19]
Goodman et al.

[11] Patent Number: 4,609,865
[45] Date of Patent: Sep. 2, 1986

[54] GROUNDING SYSTEM TEST APPARATUS

[76] Inventors: Paul R. Goodman, 4313 Lake Ridge Dr., Raleigh, N.C. 27604; Francis P. Weinheimer, 501-TA Oaklynn Ct., Pittsburgh, Pa. 15220

[21] Appl. No.: 560,907

[22] Filed: Dec. 14, 1983

[51] Int. Cl.⁴ ............................................. G01R 31/02
[52] U.S. Cl. ..................... 324/51; 307/252 T
[58] Field of Search ..................... 324/51, 424; 361/47, 361/48, 49, 50; 307/252 T

[56] References Cited

U.S. PATENT DOCUMENTS

| | | | |
|---|---|---|---|
| 3,697,809 | 10/1972 | Self | 361/41 |
| 3,971,007 | 7/1976 | Borkovitz | 361/48 |
| 4,135,129 | 1/1979 | Johnson | 324/51 |

FOREIGN PATENT DOCUMENTS 0845305  6/1970  Canada ........................... 307/252 T

OTHER PUBLICATIONS

RCA Transistor, Thyristor and Diode Manual: Technical Series SC-15, printed Apr. 1971, pp. 56-64 and 225-226.
Electronic Design: "Single Optically-Isolated Driver Controls Inverse-Parallel SCR's", vol. 28, No. 11, p. 120.

Primary Examiner—Reinhard J. Eisenzopf
Assistant Examiner—G. Peterkin
Attorney, Agent, or Firm—Buell, Ziesenheim, Beck & Alstadt

[57] ABSTRACT

The apparatus is used in conjunction with a power center or distribution box of a multi-phase trailing cable resistance grounded power system in coal mines and the like. It provides from phase voltage an adjustable low voltage current source for adjusting the ground fault relay. The voltage is obtained from a phase-controlled triac and is rich in harmonics which makes it useful in locating cable faults in conjunction with any commercially available cable fault detector which operates at power or higher frequency.

6 Claims, 2 Drawing Figures

GROUNDING SYSTEM TEST APPARATUS

BACKGROUND OF THE INVENTION

This invention relates to grounding system test apparatus and the like and particularly to apparatus which is used for adjusting the ground fault relay in multi-phase resistance grounded neutral power transmission systems and, with auxiliary apparatus, for locating faults in trailing cable power transmission systems.

In underground mining, such as sub-surface coal mines and the like, safety regulations require that the power supply in the mine be of the resistance grounded neutral type. Under such regulations the ground current is limited by the neutral grounding resistor for all voltages, for example, 480 volts, 600 volts, 995 volts, 4160 volts, 7200 volts and 13,200 volts, providing all connections and components are intact and in good working order. Major receptacles throughout the mine which are connected to the power system have a variety of devices that open the circuit breaker when ground current becomes excessive. Safety regulations provide that if the current exceeds one-half the limit value established by the neutral grounding resistor these devices must trip the breaker and disconnect the power source from the cable.

At the present time the generally accepted method for testing ground fault current is to insert a fused wire between phase and ground on the pins of an energized receptacle. Such a test is unsatisfactory because it does not insure that the grounding resistor is limiting the current or that the current level is below the acceptable limit. This test also exposes personnel to hazardous voltages which are present on the pins of the receptacles after jumper wires and/or filters have been inserted to enable the ground conductor continuity monitoring circuit, which also controls the tripping of the circuit breaker. Trailing cable power systems have a ground conductor continuity monitor of some sort which is interlocked with the circuit breaker tripping apparatus. The ground conductor continuity monitoring circuit emcompasses the ground conductor, a return path for current therethrough, means for transmitting a current through ground conductor and return path and means for detecting that current. The return path may be a pilot conductor in the trailing cable and the current may be of power frequency. Such systems are called impedance systems. If a monitoring current of frequency higher than the power frequency is employed the return path may be through the phase conductors and that current is taken off through a three-phase inductivecapacitive filter or tuned circuit. Such systems are called audible systems because the monitoring current frequency is usually in audible range.

The interlock prevents the circuit breaker from closing unless the ground conductor continuity monitor indicates continuity. In order to test the ground fault protective apparatus it is necessary to actuate the ground conductor continuity monitor so that it does indicate continuity.

When cable faults occur it is necessary to determine the location of the fault in the cable before it can be repaired If a damage area is not discovered by quick visual inspection the first step to finding a phase-to-ground short is to cut two existing splices and then check continuity with a meter. This method is time consuming and costly due to production loss and the cost of repair parts. The two other methods sometimes used, which are in violation of state and federal regulations, are:

1. Using DC current from resistance type bond welders or trolley circuits connected from phase to ground.
2. Closing the circuit breaker with the faulty phase and ground conductors connected phase-to-phase.

In recent years cable fault detector systems have become commercially available which avoid the dangers above mentioned. Those systems comprise a transmitter which supplies a relatively low voltage signal and a detector therefore. The transmitter is connected to the faulted phase and ground conductors and the transmitter signal may be of power line frequency or higher frequency. The detector is a field strength monitor which detects and indicates the strength of the electromagnetic field surrounding the cable due to the transmitter signal current. The detector need not be conductively connected to the cable but is merely held against it so as to be inductively coupled therewith. It can therefore be moved along the cable and continues to receive signals as long as the signal current is present. The voltage output of most of those transmitters will not pass enough current through high resistance faults to generate a detectable field.

SUMMARY OF THE INVENTION

The present invention overcomes the problems above mentioned and provides an apparatus which is fully protected for short circuits and can actuate interlocked ground conductor continuity monitors and circuit breakers so as to check the tripping value of ground fault relays, the tripping mechanism of the circuit breaker, the current transformer and the neutral grounding resistor, under controlled operating conditions. It is also useful in connection with existing cable fault detectors which operate on power or higher frequencies. The phase angle firing of the device provides continuously variable current sufficient for detectable fields even through high resistance faults. Its output contains sufficient noise or harmonics to actuate the majority of detectors on the market; thus our apparatus can be installed at power centers and distribution boxes throughout a mine, and operate with almost any detector. It will enable an operator to find high resistance faults. With this invention and method virtually any phase-to-ground fault that causes tripping should be able to be found.

DESCRIPTION OF PREFERRED EMBODIMENT

Figure 1:
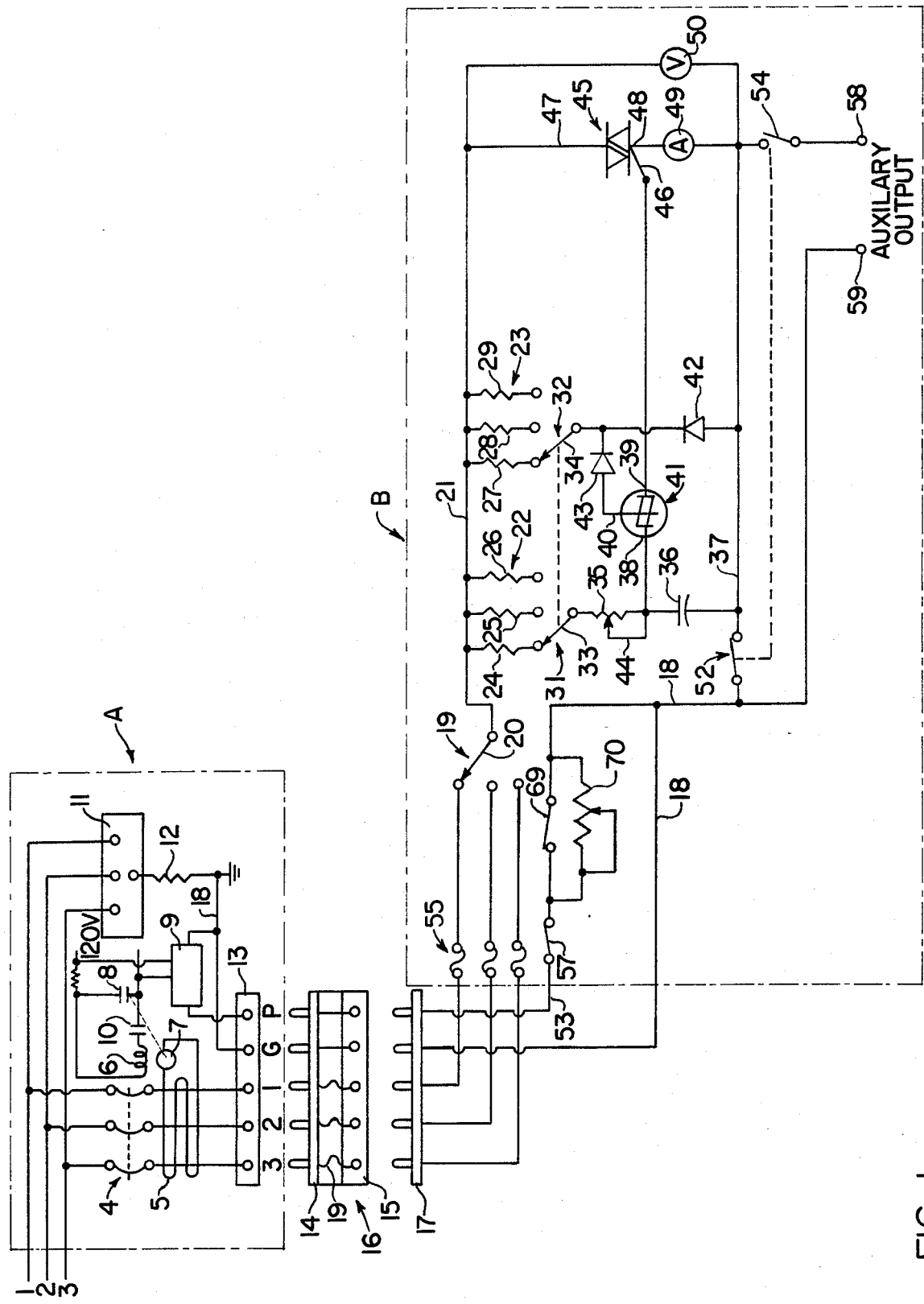
FIG. 1 is a schematic of a power center with impedance ground conductor continuity monitoring apparatus together with a first embodiment of our apparatus suitable for connection thereto.

In FIG. 1, our apparatus is preferably assembled in its own box or protective container B which is mounted in or alongside a conventional power center or distribution box A in a coal mine or similar location. The power center A has its output terminals connected to a socket 13 which mates with a plug 14. The mining machine or other power consuming apparatus is connected to power center A by a trailing cable having a plug similar to plug 14 at its end. At the power center A the phase conductors 1, 2 and 3 are connected to a transformer 11, the midpoint of which is connected through resistor 12 to ground 18. The phase conductors are connected to socket 13 through a three-phase circuit breaker 4, the undervoltage coil 6 of which is connected to the 120 volt supply through contacts 10. The undervoltage coil is shunted by parallel contacts 8 of the ground fault relay. A series resistance prevents shorting the supply line. As all three phase conductors are coupled to current transformer 5, any current unbalance arising from contact between a phase conductor and ground causes the coil 7 of the ground fault relay to be energized, which results in the closure of contacts 8. Contacts 10 are closed by ground conductor continuity monitor 9 which is operated from the 120 volt supply and is connected between ground 18 and the pilot conductor jack of socket 13. The ground jack of that socket is connected to ground 18.

Our apparatus preferably has its input terminals connected by a cable to a plug 17 so that it can be plugged into a socket 15 of a fused connector 16 comprising plug 14, socket 15 and fuses 19 connecting the phase pins of plug 14 with the corresponding jacks of socket 15. The remaining pins in plug and socket are connected directly. In our device the phase conductors are brought into a triple fuse holder 55 which is connected to the respective taps of three-point tap switch 19. Slider 20 of that switch is connected to conductor 21. That conductor is also connected to two groups 22 and 23 each of three voltage dropping resistors. The voltage dropping resistors are selected to permit operation of our device on any of several voltages. Resistors 24, 25 and 26 in group 22 are selected to permit operation of our device on lines of 480, 600 and 995 volts respectively, and resistors 27, 28 and 29 of group 23 are selected for the same operating voltages respectively. Our apparatus can be adapted to other operating voltages by using stacked silicon controlled rectifiers with proper firing circuits or other similar arrangments for use at elevated voltages. Resistors 24, 25 and 26 are connected to the taps of a second three-point tap switch 31 and resistors 27, 28 and 29 are connected to the taps of a third three-point tap switch 32. The sliders 33 and 34 of switches 31 and 32 respectively are ganged.

Slider 33 of switch 31 is connected to an end of variable resistor 35 the other end of which is connected through capacitor 36 to conductor 37. Slider 34 of switch 32 is connected to the cathodes of diodes 42 and 43. The anode of diode 42 is connected to conductor 37. The anode of diode 43 is connected to the gate 40 of silicon bilateral switch 41. One terminal 38 of that switch is connected to the junction of resistor 35 and capacitor 36 and to slider 44. The other terminal 39 of silicon bilateral switch 41 is connected to gate 46 of triac 45. One terminal 47 of triac 45 is connected to conductor 21 and the other terminal 48 is connected to conductor 37 through ammeter 49. Voltmeter 50 is connected between conductors 21 and 37.

Conductor 37 is connected to ground conductor 18 through make-and-break switch 52 and auxiliary output lead 58 is connected to conductor 37 through make-and-break switch 54. Switches 52 and 54 are ganged so that when one is opened the other is closed. Conductor 18 may be connected to pilot conductor 53 through a make-and-break switch 57.

In the operation of the embodiment of our apparatus above described connector 16 properly fused is plugged into socket 13 of power center A. Switches 31 and 32 of our apparatus B are turned to select dropping resistors appropriate to the phase voltage and switch 19 is turned to the contact of one of the phase conductors. For the purpose of ground fault relay adjustment, any phase may be selected. A fuse is inserted in the selected phase contacts of fuse holder 55. Plug 17 is then plugged into socket 15 of connector 16. Switch 57 is normally closed, thus connecting pilot and ground jacks of power center socket 13. Ground conductor continuity monitor 9 then indicates continuity and closes contacts 10, admitting current to coil 6 and allowing circuit breaker 4 to be set. Phase voltage is thus put on the jacks of socket 13 and apparatus connected therewith. Slider 44 of variable resistor 35 is moved toward minimum causing triac 45 to conduct; thereby passing current through ground resistor 12. That current is indicated by ammeter 49. When that current is adjusted to the limit value by setting slider 44, ground fault relay 7 can be adjusted to trip circuit breaker 4.

The magnitude of the test current is adjusted by triac 45. That triac is switched from nonconducting to conducting state by a gate pulse derived from timing capacitor 36. A prior art circuit for that purpose has a diac in place of our silicon bilateral switch 41 but no resistors 23 or diodes 42 and 43. In such a circuit adjustment of variable resistor 44 to prevent conduction through triac 45 also prevents timing capacitor 36 from discharging. Abnormal amounts of apparent phase shift thus result from capacitor 36 beginning to charge toward a source of voltage across it which opposes its residual charge of the opposite polarity. This condition produces undesirable hysteresis when resistor 35 is adjusted. In our circuit above described such hysteresis is avoided by the use of our silicon bilateral switch 41 in place of the diac, and the resistor-diode network comprising resistors 23 and diodes 42 and 43. At the end each positive half cycle the applied voltage will drop below the voltage on capacitor 36. This permits gate current to silicon bilateral switch 11 to flow through diode 43 and one of the resistors in resistor bank 23, thus switching silicon bilateral switch "on" and discharging capacitor 36 to substantially zero volts. Switch 69 and resistor 70 are used to check impedance ground conductor continuity monitor 9.

Figure 2:
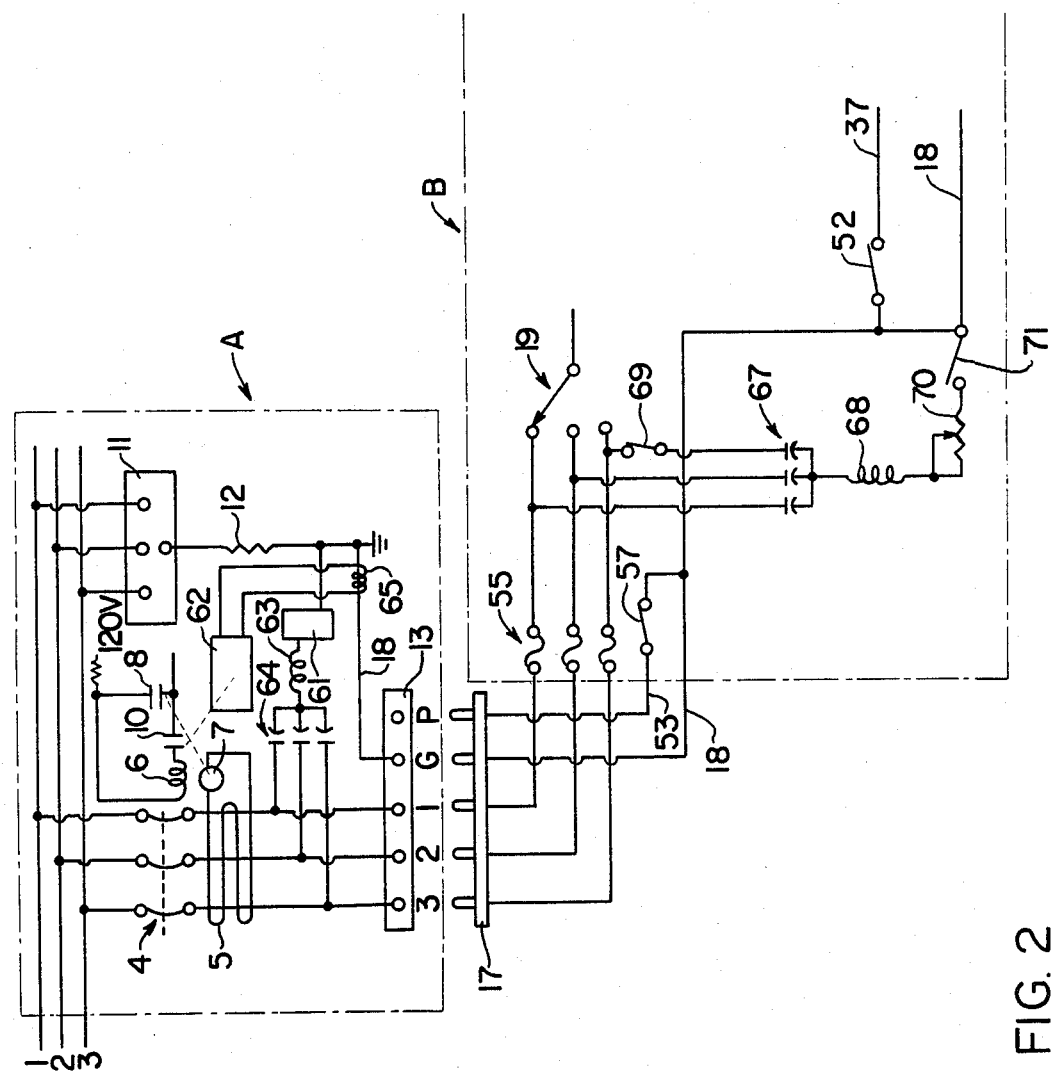
FIG. 2 is a schematic of a power center with audible ground conductor continuity monitoring apparatus, together with a portion of a second embodiment of our apparatus suitable for connection therewith.

A second embodiment of our invention adapted to audible ground conductor continuity monitoring devices is shown in FIG. 2. That Figure shows schematically a power center A with an audible monitoring device but only the portion of our apparatus B which differs from that apparatus of FIG. 1. Like components of the two Figures carry the same reference characters. At the power center A the audible continuity monitor comprises a transmitter 61, and a receiver 62, which may be in the same case. Both are conveniently operated from the 120 volt line. One output terminal of transmitter 61 is connected to ground. The other output terminal is connected to one end of inductor 63, the other end of which is connected to the junction of three capacitors, collectively designated 64. The other terminal of each capacitor 64 is connected to a separate phase conductor. The three capacitors have the same value and with inductor 63 are adjusted to resonate at the frequency of transmitter 61, which is above the power frequency. Thus, the capacitor-inductor combination forms a filter or tuned circuit which allows the phase conductors to constitute the return path for the ground conductor continuity monitoring circuit. The receiver 62 is coupled to ground conductor 18 by coil 65 and operates contacts 10 as has been described hereinabove. The remainder of power center A is the same of that of FIG. 1.

Our apparatus as before has its input terminals connected by a cable to plug 17 and the phase conductors are brought into triple fuse holder 55. Inside the enclosure of B each phase conductor is connected to a terminal of a separate capacitor designated collectively as 67, one conductor through a make-and-break switch 69. The other terminals of those capacitors are connected together and to one end of inductor 68, the other terminal of which is connected through a make-and-break switch 71 in series with a variable resistor 70 with ground conductor 18. Again the three capacitors have the same value and resonate with the inductor at the frequency of transmitter 61 of power center A. The remainder of our apparatus B is the same as that of FIG. 1.

In operation, plug 17 is plugged into socket 15 of connector 16 and plug 14 of that connector is plugged into socket 13 of power center A as before, or otherwise connected. When switch 57 is closed it connects a possible interlocking circuit that would operate contacts 10. Transmitter 61 applies audible signals on the phase conductors 1, 2 and 3 via coil 63 and capacitors 64, which signal returns on ground conductor 18 via capacitors 67 and coil 68. Receiver 62 therefore picks up that signal and closes contacts 10, permitting circuit breaker 4 to be set as before.

Terminals 58 and 59 provide an auxiliary output from our apparatus which may be used together with a field strength type detector for locating cable faults. Our apparatus furnishes a variable voltage large enough to detect high resistance cable faults but fused and current limited to minimize danger. Triac 45 is adjusted as described hereinabove to deliver a voltage wave extending over less than a full cycle and therefor having an average value less than that of the full cycle voltage. The wave shape is distorted by the cut-off, thus resulting in high harmonic content extending into the range detectable by field strength monitors. The voltage so obtained is applied between the faulted phase conductor and ground conductor, and a portable field strength monitor is moved along the phase conductor, tracing the signal to the fault. The average current of the chopped or distorted wave is adjusted to be less than that which would cause circuit breaker 4 to trip.

In the foregoing specification we have described a presently preferred embodiment of our invention; however, it will be understood that our invention can be otherwise embodied within the scope of the following claims.

We claim:

1. Test apparatus for a polyphase circuit-breaker-protected alternating current power system having its neutral conductor connected to ground through a resistor comprising solid state switching means powered by a phase votage of said system for generating a low voltage system frequency test current, overload protected means for introducing said test current into said system, and means for adjusting said test current through said ground resistor to a predetermined value, said means comprising a timing capacitor connected between said ground connector and an adjustable resistor, a silicon bilateral switch having two terminals and a gate connected between the junction of said timing capacitor and said adjustable resistor and the gate of said solid state switching means, means connecting the other end of said adjustable resistor with said selected phase conductor, means connecting the gate of said silicon bilateral switch with said selected phase conductor and means connected to said timing capacitor for applying to it a voltage which drops below the voltage on said capacitor at the end of each voltage cycle whereby said circuit breaker can be caused to trip at said predetermined value of current.

2. Apparatus of claim 1 in which the means for applying to said timing capacitor a voltage which drops below the voltage on said capacitor at the end of each positive cycle comprise a pair of diodes having their cathodes connected together, means connecting the anode of one of said diodes to the ground conductor, means connecting the anode of the other of said diodes to the gate of said silicon bilateral switch and means connecting said diode cathodes with said selected phase conductor.

3. Apparatus of claim 2 including a voltage dropping resistor connected between the junction of said diode cathodes and said selected phase conductor.

4. Apparatus of claim 1 in which said alternating current power system is provided with a plug-in receptacle and said test apparatus is provided with a mating plug.

5. Appartus of claim 4 in which said means for introducing said test current into said system comprises a fuse connector combining plug and receptacle which mates with said power system receptacle and with said test apparatus plug.

6. Apparatus of claim 4 in which said receptacle and said plug include a ground terminal and a pilot conductor terminal for ground conductor continuity monitoring appartus and in which said test apparatus includes switching means for connecting said ground and pilot terminals.

* * * * *

UNITED STATES PATENT AND TRADEMARK OFFICE
CERTIFICATE OF CORRECTION

PATENT NO. : 4,609,865

DATED : September 2, 1986

INVENTOR(S) : PAUL R. GOODMAN, FRANCIS P. WEINHEIMER

It is certified that error appears in the above-identified patent and that said Letters Patent is hereby corrected as shown below:

Column 1, line 63, after "repaired" insert --.--.

Column 4, line 37, after "end" insert --of--.

Column 6, line 6, change "votage" to --voltage--.

Column 6, line 50, change "appartus" to --apparatus--.

Signed and Sealed this

Fourth Day of November, 1986

[SEAL]

Attest:

DONALD J. QUIGG

Attesting Officer     Commissioner of Patents and Trademarks